United States Patent [19]
Hoshiba

[11] Patent Number: 5,412,596
[45] Date of Patent: May 2, 1995

[54] SEMICONDUCTOR STORAGE DEVICE WITH A FERROELECTRIC TRANSISTOR STORAGE CELL

[75] Inventor: Kazuhiro Hoshiba, Kyoto, Japan
[73] Assignee: Rohm Co., Ltd., Kyoto, Japan
[21] Appl. No.: 235,149
[22] Filed: Apr. 28, 1994

Related U.S. Application Data

[63] Continuation of Ser. No. 961,955, Oct. 16, 1992, abandoned.

[30] Foreign Application Priority Data

Oct. 25, 1991 [JP] Japan .................................. 3-279632

[51] Int. Cl.⁶ ............................................. G11C 11/22
[52] U.S. Cl. ..................................... 365/145; 257/295
[58] Field of Search ................ 365/145, 185, 149; 257/295

[56] References Cited

U.S. PATENT DOCUMENTS

| | | | |
|---|---|---|---|
| 4,161,038 | 7/1979 | Wu | 365/145 |
| 4,873,664 | 10/1989 | Eaton, Jr. | |
| 4,888,630 | 12/1989 | Paterson | 365/145 |
| 5,010,520 | 4/1991 | Minagawa et al. | 365/185 |
| 5,197,027 | 3/1993 | Challa | 365/185 |
| 5,198,994 | 3/1993 | Natori | 365/145 |
| 5,218,568 | 6/1993 | Lin et al. | 365/185 |

*Primary Examiner*—Do Hyun Yoo
*Assistant Examiner*—Son Dinh
*Attorney, Agent, or Firm*—Nikaido, Marmelstein, Murray & Oram

[57] ABSTRACT

A semiconductor storage device having a memory array composed of storage ceils arranged in a matrix. The storage cells include a ferroelectric transistor having a metal-ferroelectrics-semiconductor structure and a switching transistor. A source electrode of one of the transistors and a drain electrode of the other transistors are connected to each other. According to the present invention, the necessary time for writing becomes short, realizing a rapid operation of nano second order. Further, many times ($10^{10}$ order) of rewriting is possible. This brings a longer life thereof compared with a EEPROM which is rewritable about $10^4$ times. Since the reading out is non-destructive, the rewriting is not required so that the life of the device is further lengthened.

2 Claims, 4 Drawing Sheets

SEMICONDUCTOR STORAGE DEVICE WITH A FERROELECTRIC TRANSISTOR STORAGE CELL

This application is a continuation of application Ser. No. 07/961,955 filed Oct. 16, 1992, now abandoned.

FIELD OF THE INVENTION

The present invention relates to a nonvolatile semiconductor storage device employing a ferroelectric film capacitor. A semiconductor storage device of the present invention has a memory array wherein storage cells employing a ferroelectric film and a field-effect transistor (hereinafter referred to as FET) are arranged in a matrix.

BACKGROUND OF THE INVENTION

A conventional memory array is shown in FIGS. 6 and 7. The array comprises storage cells, each employing a ferroelectric film capacitor, arranged in a matrix.

The memory array in FIG. 6 is disclosed in U.S. Pat. No. 4,873,664, where a ferroelectric film capacitor C is connected with a source electrode of a switching transistor ST to form a storage cell.

The memory array in FIG. 7 disclosed in Japanese Unexamined Patent Publication No. 64993/1990, where a switching transistor ST is connected in series with the front and the rear of a metal-ferroelectrics-semiconductor transistor (hereinafter referred to as ferroelectric transistor FT) to form a storage cell. The ferroelectric transistor FT is one of FET and a ferroelectric film is used as a gate insulating film thereof.

The March 1990 issue of NIKKEI MICRODEVICES reports in pp. 72–77 that flash-type EEPROMS are is earnestly being developed as nonvolatile storage cells.

When reading out a storaged information from the memory array shown in FIG. 6, the polarized direction of the ferroelectric film is reversed and the storaged information is destroyed. This "destructive reading" which requires rewriting cell after reading out. Thus, such a semiconductor storage device has a disadvantage that the operation thereof is complicated.

The memory array shown in FIG. 7 enables nondestructive reading. However, it requires three transistors per bit. Thus, it has a disadvantage that its cell area must be enlarged.

In a flash-type EEPROM which is being earnestly developed today, it takes a long time (microsecond order) for writing. This is three orders of magnitude slower than that of the storage cell employing a ferroelectric film capacitor or of DRAM, of which necessary time for writing is nano second order. Thus, the flash-type EEPROM has a disadvantage that the necessary time for writing is very long.

SUMMARY OF THE INVENTION

In view of the above-mentioned problems, an object of the present invention is to provide a semiconductor storage device in which the necessary time for writing is short, in which reading out is non-destructive and in which the cell area is small. A semiconductor storage device of the present invention uses a nonvolatile memory array composed of storage cells employing a ferroelectric film.

According to the present invention, there is provided a semiconductor storage device having a memory array composed of storage cells arranged in a matrix, wherein the storage cells comprise a ferroelectric transistor having a metal-ferroelectrics-semiconductor structure and a switching transistor, and a source electrode of one of the transistors and a drain electrode of the other transistor are connected to each other.

The memory array in a semiconductor device of the present invention comprises a first word line, a second word line, a bit line and a source line, the first word line connecting gate electrodes of switching transistors in one lateral or lingitudinal line of the array; the second word line connecting gate electrodes of ferroelectric transistors one lateral or longitudinal line of the array; bit line connecting drain electrodes of ferroelectric transistors or switching transistors in one longitudinal or lateral line perpendicular to the second word line, the drain electrodes not being connected to source electrodes of ferroelectric transistors or switching transistors; and the source line connecting source electrodes of switching transistors or ferroelectric transistors and semiconductor substrates to the ground, the source electrodes not being connected to drain electrodes of switching transistors or ferroelectric transistors.

In a semiconductor storage device of the present invention, one ferroelectric transistor and one switching transistor are connected in series to form a storage cell. Due to this, writing to a desired storage cell can be performed by selecting the word line and the bit line, and erasing can be performed per each word line. Further, reading out from a desired storage cell can be performed by selecting the word line connecting the gate electrodes of the switching transistor and the bit line.

DETAILED DESCRIPTION

A semiconductor storage device of the present invention is explained below with reference to the drawings.

In FIGS. 1 to 5, numeral 1 represents a source region wherein n+ impurity is diffused. Numeral 2 represents a drain region wherein n+ impurity is diffused. Numerals 3, 4 and 5 respectively represent a p-type silicon semiconductor substrate, a ferroelectric film and a gate electrode. Symbols WL1 (WL1a, WL1b) and WL2 (WL2a, WL2b) respectively represent a first word line and a second word line. Symbols BL (BLa, BLb) and SL respectively represent a bit line and a source line. Numerals 13 and 14 respectively represent an insulating film. Numeral 15 represents a gate insulating film.

Figure 1:
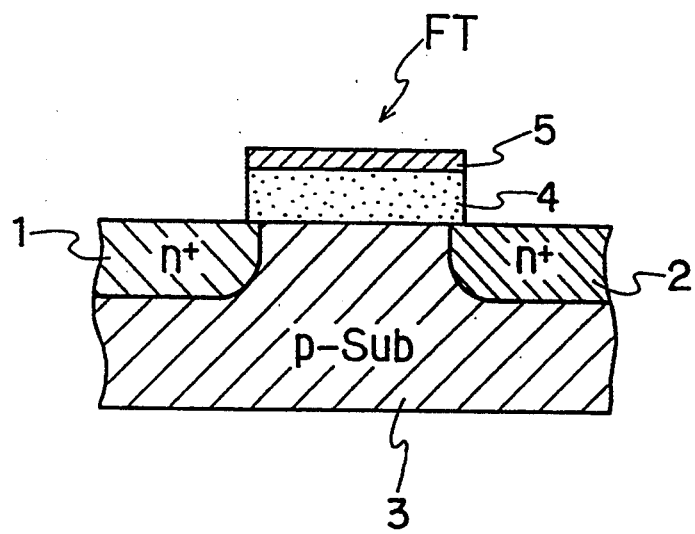
FIG. 1 is a cross section showing a structure of a transistor with a ferroelectric film capacitor.
Figure 2:
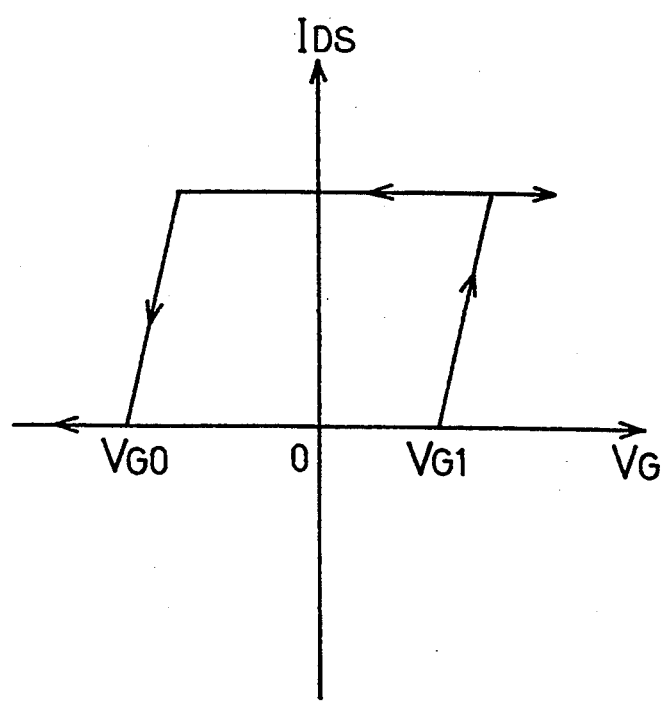
FIG. 2 is a graph showing a hysteresis characteristic of a ferroelectric transistor.

The operation of the transistor having the ferroelectric film 4 is explained based on FIGS. 1 and 2. FIG. 1 is a cross section of a ferroelectric transistor employing a ferroeletric film capacitor. FIG. 2 is a graph showing a relationship between the gate voltage applied to the ferroelectric transistor and the current flowing between source and drain. The ferroelectric transistor FT is one obtained by replacing a gate insulating film of a MISFET (metal-insulator-semiconductor FET) with a ferroelectric film. In the FT of this embodiment, a ferroeletric film 4 and a gate electrode 5 are formed on a p-type semiconductor substrate 3 as shown in FIG. 1. n+ impurity is diffused therearound to form a source region 1 and a drain region 2. When a voltage higher than a certain value is applied between the gate electrode 5 and the substrate 3, a residual polarization is brought because of the hysteresis characteristic of the ferroelectric film 4. Thus, even if electric potential of the electrode 5 is made to be 0 V, a current flows between the source and the drain. This relationship is shown in FIG. 2.

In the graph of FIG. 2, the axis of abscissa indicates gate voltage $V_G$ and the axis of the ordinate indicates current $I_{DS}$ between the source and the drain. Hysteresis characteristic is shown in the relationship between the voltage and the current. Once a voltage higher than $V_{G1}$ is applied to the FT, current keeps on flowing unless the applied voltage is lowered to $-V_{G0}$ or less. In this specification, this condition (the current is on) is defined as written and this is indicated by "1". When the applied voltage is lowered to $-V_{G0}$ or less, the current between the source and the drain stops flowing. In this specification, this condition (the current is off) is defined as erased and this is indicated by "0".

Thus, by making the ON condition correspond to the "1" and the OFF condition to the "0", each storage cell serves as a memory. When reading out, a voltage is applied between the source and the drain, and a condition of a ferroelectric film (ON or OFF) can be distinguished from the fact that current flows or not, or voltage drop happens or not. Thus, the polarized direction of the ferroelectric film does not reverse when reading out, that is, non-destructive reading out can be performed.

A constitution of a memory array is explained below. In this memory array, the ferroelectric transistor FT and the switching transistor ST are connected in series to form a storage cell and this cell is arranged in a matrix.

Figure 3:
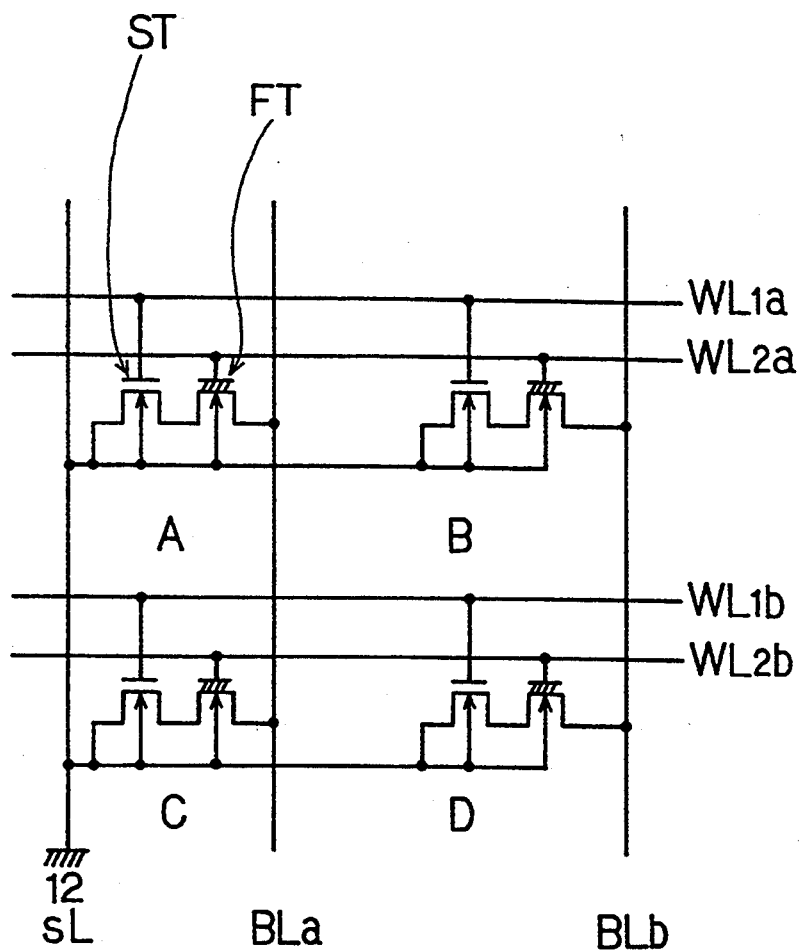
FIG. 3 is an explanatory view showing a structure of an embodiment of a memory array of the present invention.

As shown in FIG. 3, storage cells A, B, C, and D are respectively formed by connecting one ferroelectric transistor FT and one switching transistor in series. In this embodiment, a source electrode of the transistor FT and a drain electrode of the transistor ST is connected.

These storage cells are arranged in a matrix to form a memory array. In FIG. 3, four memory cells A, B, C and D are arranged in two longitudinal lines and in two lateral lines, and electrodes of each cell are wired to form an array. The array comprises first word lines WL1a and WL1b, second word lines WL2a and WL2b, bit lines BLa and BLb, and a source line. The first word line WL1a connects the gate electrodes of the switching transistors ST of the storage cells A and B, and the first word line WL1b connects the gate electrodes of the switching transistors ST of the storage cells C and D. The second word line WL2a connects the gate electrodes of the ferroelectric transistors FT of the storage cells A and B, and the second word line WL2b connects the gate electrodes of the ferroelectric transistors FT of the storage cells C and D. The bit line BLa connects the drain electrodes of the ferroelectric transistors FT of the storage cells A and C. The bit line BLb connects the drain electrodes of the ferroelectric transistors FT of the storage cells B and D. The source line SL connects the source electrodes of the switching transistors and the semiconductor substrates of all the storage cells to ground.

Hereinafter how the constitution serves as a memory array is explained. In this explanation the storage cell A serves as a selected cell carrying out writing, and the other cells B, C and D respectively serve as a non-selected cell.

The writing is carried out as follows. When a voltage not lower than $V_{G1}$ is applied to the second word line WL2a, the "1" which corresponds to an ON condition is stored in the cell A. At this operation, a voltage $V_D$ is applied to the bit line BLb. The voltage $V_D$ is so selected that it is smaller than the voltage $V_{G1}$, however, the difference between the $V_{G1}$ and $V_D$ does not cause a reverse of a polarized direction of the ferroelectric film and allows a depletion layer to extend at channel. For this reason, by applying such voltage $V_D$ to the bit line BLb, the storage cell B is prevented from being written into. The voltage $V_D$ must be smaller than the voltage $V_D$ also for preventing a reverse of the condition of the storage cell from ON to OFF. Electrical potential of all the other lines are kept at 0 V.

The erasing is carried out as follows. When a voltage not higher than $-V_{G0}$ is applied to the second word line WL2a, the storage cells A and B can be set at "0" (the condition OFF). That is, the erasing is carried out per each line like a flash memory or the like. In the operation, electric potential of all the other lines are kept at 0 V.

Figure 4:
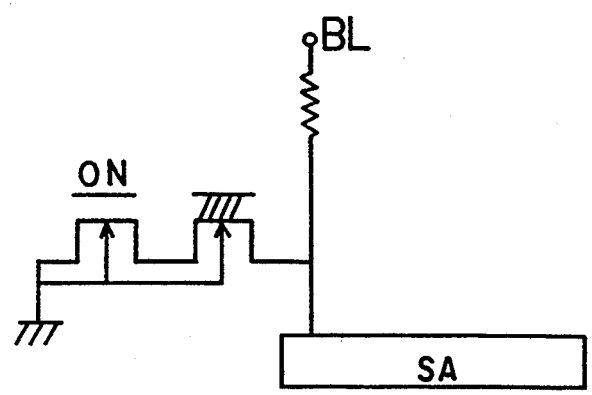
FIG. 4 is an explanatory view showing a condition where a bit line in the memory array is connected with a sense amplifer circuit.

The reading out is carried out as follows. Electric potential of the first word line WL1a is set at a voltage $V_{th}$ which causes the switching transistor to be ON. The bit line BLa is precharged at a reference voltage, and is connected to a sense amplifier SA as shown in FIG. 4. Electric potential of all the other lines are kept at 0 V. In this condition, if the ferroelectric transistor FT stores the "1", current flows between the drain and the source, and the voltage of the bit line BLa drops. On the other hand, if the ferroelectric transistor FT stores "0", current does not flow between the drain and the source, and the voltage of the bit line BLa does not drop. Thus it can be found whether the ferroelectric transistor FT of the storage cell stores the "1" or the "0", by the fact that the applied voltage to the bit line BLa drops or not.

Those relationships are summarized in Table 1. In Table 1, symbols 0 mean that each line is grounded.

TABLE 1

|  | WL1a | WL2a | BLa | WL1b | WL2b | Blb |
|---|---|---|---|---|---|---|
| writing | 0 | $V_{G1}$ or more | 0 | 0 | 0 | $V_D$ |
| erasing | 0 | $-V_{G0}$ or less | 0 | 0 | 0 | 0 |
| reading out | $V_{th}$ | 0 | SA | 0 | 0 | 0 |

Figure 5:
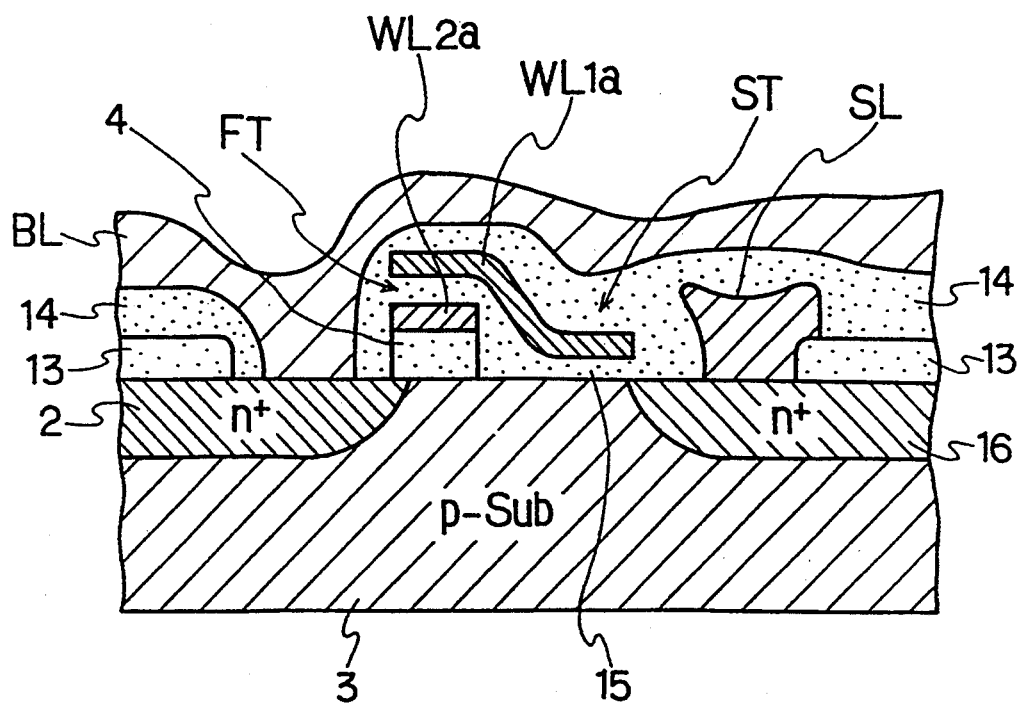
FIG. 5 is a cross section of a semiconductor structure of an embodiment of a storage cell of the present invention.
Figure 6:
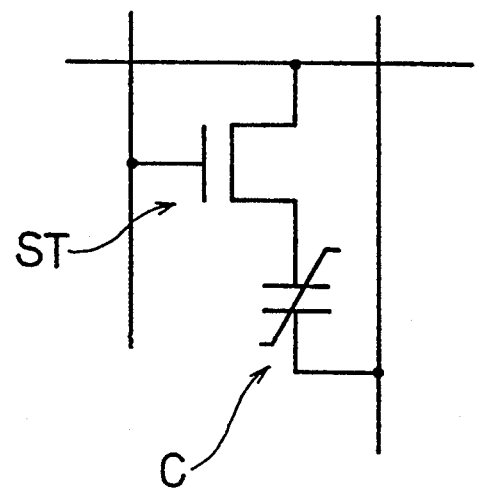
FIG. 6 is a circuit diagram of a conventional storage cell.
Figure 7:
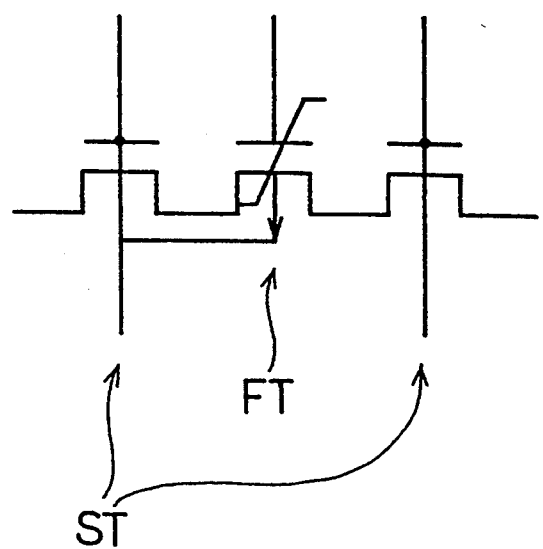
FIG. 7 is a circuit diagram of another conventional storage cell.

One of such storage cells is shown in FIG. 5 with a cross section of its semiconductor. In FIG. 5, numeral 2 represents a drain region of a ferroelectric transistor FT. Numeral 16 represents a source region of a switching transistor ST, and this region 16 is grounded by the source line SL. Between the drain region 2 and the source region 16, a channel region is defined. The channel region is partly covered by ferroelectric film 4 which is directly formed on semiconductor substrate 3. The ferroelectric film 4 has a first gate electrode on top of it to form the ferroelectric transistor FT. The part of the channel which remains uncovered by the ferroelectric film 4 is covered by a second gate electrode with gate insulating film 15 interposed therebetween to form the switching transistor ST. The second gate electrode extends over the first gate electrode to complete the flow of carrier between the transistors FT and ST. The first and the second gate electrodes are connected with the second and the first word lines WL2a and WL1a, respectively. As a material for the ferroelectric film, PZT (PbZr$_{1-x}$Ti$_x$O$_3$), PLZT ((Pb$_{1-x}$La$_x$)(Zr$_{1-y}$Ti$_y$)$_{1-x/4}$, O$_3$) or the like can be preferably employed because of their high spontaneous polarization. As a material for the word line and bit line, a doped polysilicon with phosphorus is typical, however, a metal such as platinum can replace the doped polysilicon.

In the above-mentioned embodiment, the source electrode of the ferroelectric transistor FT and the drain electrode of the switching transistor ST are connected to form a storage cell. However, the transistors FT and ST are interchangable to each other. In that case, the source electrode of the transistor FT is grounded by the source line SL, and the drain electrode of the transistor ST is connected with the bit line. In the above-mentioned embodiment, the first and the second word lines WL1 and WL2 connect the lateral lines of the transistors, and the bit lines connect the longitudinal lines of the transistors. However the way of connection is not limited thereto. The word lines WL2 and the bit line are interchangable to each other as long as they cross perpendicularly to each other.

As explained above, according to the present invention, a storage cell is composed of one ferroelectric transistor and one switching transistor, and a memory array is constituted with the storage cells. For this reason, a storage device of the present invention can be made smaller. Further, a condition of the ferroelectric film ("1" or "0") can be distinguished from the fact that current flows or not under the applied voltage, whereby the polarized direction of the ferroelectric film does not reverse, that is, non-destructive reading out can be carried out.

A storage device of the present invention employs a ferroelectric film capacitor, so that the necessary time for writing becomes short whereby realizing a rapid operation of nanosecond order. Further, many times ($10^{10}$ order) of rewriting is possible. This brings a longer life thereof compared with a EEPROM which is rewritable about $10^4$ times. Since the reading out is non-destructive, the rewriting is not required so that the life of the device is further lengthened.

Thus, there can be realized a storage device having a small-sized and easy-to-use memory array with high performance and this greatly contributes to the development of recent electronics.

Though several embodiments of the present invention are described above, it is to be understood that the present invention is not limited only to the above-mentioned, various changes and modifications may be made in the invention without departing from the spirit and scope thereof.

What is claimed is:

1. A semiconductor storage device having a memory array composed of storage cells arranged in a matrix on a semiconductor substrate, said storage cells each comprising:
   a ferroelectric transistor having source and drain regions provided in said semiconductor substrate, a ferroelectric film provided directly on a surface of said semiconductor substrate between said source and drain regions, and a first gate electrode provided on said ferroelectric film, said ferroelectric transistor to store information by utilizing residual polarization of said ferroelectric film; and
   a switching transistor having a channel region provided in said semiconductor substrate and adjacent to said ferroelectric transistor, and a second gate electrode provided over both the channel region and said first gate electrode;
   wherein a source electrode of one of the two transistors is connected to a drain electrode of the other transistor.

2. The semiconductor device of claim 1, wherein the memory array comprises a first word line, a second word line, a bit line and a source line,
   the first word line connecting gate electrodes of switching transistors in one lateral or longitudinal line of the array;
   the second word line connecting gate electrodes of ferroelectric transistors in one lateral or longitudinal line of the array;
   the bit line connecting drain electrodes of one of said switching or ferroelectric transistors of which source electrodes are connected to drain electrodes of the other one of said switching or ferroelectric transistors in one longitudinal or lateral line which is perpendicular to the second word line; and
   the source line connecting source electrodes of said other one of said switching or ferroelectric transistors and said semiconductor substrate to ground.

* * * * *